(12) United States Patent
Peterson et al.

(10) Patent No.: US 11,903,166 B2
(45) Date of Patent: Feb. 13, 2024

(54) SYSTEMS AND METHODS FOR IMMERSION COOLING WITH SUBCOOLED SPRAY

(71) Applicant: Microsoft Technology Licensing, LLC, Redmond, WA (US)

(72) Inventors: Eric C. Peterson, Woodinville, WA (US); Husam Atallah Alissa, Redmond, WA (US); Bharath Ramakrishnan, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 20 days.

(21) Appl. No.: 17/333,298

(22) Filed: May 28, 2021

(65) Prior Publication Data
US 2022/0248559 A1 Aug. 4, 2022

Related U.S. Application Data

(60) Provisional application No. 63/144,371, filed on Feb. 1, 2021.

(51) Int. Cl.
*H05K 7/20* (2006.01)
(52) U.S. Cl.
CPC ......... *H05K 7/203* (2013.01); *H05K 7/20327* (2013.01); *H05K 7/20336* (2013.01); *H05K 7/20381* (2013.01)
(58) Field of Classification Search
CPC ............... H05K 7/203; H05K 7/20809; H05K 7/20318; H05K 7/20236; H05K 7/20272;
(Continued)

(56) References Cited

U.S. PATENT DOCUMENTS 5,220,804 A * 6/1993 Tilton ................... B64G 1/50
257/E23.088
5,349,831 A * 9/1994 Daikoku ............... H01L 23/427
165/80.4
(Continued)

FOREIGN PATENT DOCUMENTS

EP 3177125 B1 12/2019
WO 2019150061 A1 8/2019
(Continued)

OTHER PUBLICATIONS

"3M™ Two-Phase Immersion Cooling—High Level Best Practices for System Fabrication", Retrieved from: https://web.archive.org/web/20150726183449/https:/multimedia.3m.com/mws/media/1010266O/3m-two-phase-immersion-cooling-best-practices-technical-paper.pdf, Jul. 26, 2015, 4 Pages.
(Continued)

*Primary Examiner* — Mandeep S Buttar
(74) *Attorney, Agent, or Firm* — RAY QUINNEY & NEBEKER P.C.; Paul N. Taylor

(57) ABSTRACT

A thermal management system for cooling electronics includes an immersion tank, a working fluid in the immersion tank, a heat exchanger, a first fluid conduit, and a second fluid conduit. The heat exchanger is configured to transfer thermal energy from the working fluid to ambient air to cool the working fluid. The first fluid conduit provides fluid communication from the immersion tank to the heat exchanger, and the second fluid conduit provides fluid communication from the heat exchanger to a spray nozzle to spray working fluid into the immersion tank.

20 Claims, 5 Drawing Sheets

(58) Field of Classification Search

CPC ........... H05K 7/20281; H05K 7/20381; H05K 7/20336; H05K 7/20309; H05K 7/208; H05K 7/20; H05K 7/20836; H05K 7/2029; H05K 7/20345; H05K 7/20881; H05K 7/20936; F28D 15/02; F28D 15/0266; G06F 1/20; G06F 2200/201; G06F 1/206; H01L 23/44; H01L 23/427

USPC ......... 361/700, 679.53, 679.31, 699, 679.46; 165/80.4, 301, 104.33, 244

See application file for complete search history.

(56) References Cited

U.S. PATENT DOCUMENTS

| | | | | |
|---|---|---|---|---|
| 5,522,452 | A | * | 6/1996 | Mizuno ................. H01L 23/427 165/286 |
| 5,890,371 | A | * | 4/1999 | Rajasubramanian . F24F 5/0042 62/332 |
| 5,943,211 | A | * | 8/1999 | Havey ................... H01L 25/105 174/15.1 |
| 6,498,725 | B2 | * | 12/2002 | Cole ...................... F25B 39/028 165/104.31 |
| 6,889,515 | B2 | * | 5/2005 | Tilton ................. H01L 23/4735 62/304 |
| 6,973,801 | B1 | * | 12/2005 | Campbell ............. H01L 23/473 361/698 |
| 7,450,378 | B2 | * | 11/2008 | Nelson ................ H01L 23/4735 361/689 |
| 7,885,070 | B2 | | 2/2011 | Campbell et al. |
| 7,992,626 | B1 | * | 8/2011 | Tilton ................. H01L 23/4735 361/25 |
| 8,194,406 | B2 | | 6/2012 | Campbell et al. |
| 9,383,145 | B2 | * | 7/2016 | Weber ................. F28D 15/0266 |
| 9,901,007 | B1 | * | 2/2018 | Reynov ............... H05K 7/20309 |
| 10,321,603 | B1 | * | 6/2019 | Banerjee .............. H05K 7/20318 |
| 10,624,237 | B2 | | 4/2020 | Enright et al. |
| 2001/0002541 | A1 | * | 6/2001 | Patel ................... H05K 7/20345 62/171 |
| 2004/0250562 | A1 | * | 12/2004 | Adiga ................. H05K 7/20345 62/304 |
| 2006/0162363 | A1 | * | 7/2006 | Sharma ............... H01L 23/4735 257/E23.1 |
| 2007/0144708 | A1 | * | 6/2007 | Tilton ................. H05K 7/20345 165/104.31 |
| 2007/0193285 | A1 | | 8/2007 | Knight et al. |
| 2008/0066892 | A1 | * | 3/2008 | Tilton ................. H05K 7/20345 165/104.31 |
| 2014/0216686 | A1 | | 8/2014 | Shelnutt et al. |
| 2020/0178414 | A1 | | 6/2020 | Bulinski et al. |

FOREIGN PATENT DOCUMENTS

| | | | |
|---|---|---|---|
| WO | 2020170079 A1 | 8/2020 | |
| WO | WO-2020176746 A1 * | 9/2020 | ................ F24F 1/14 |

OTHER PUBLICATIONS

"International Search Report and Written Opinion Issued in PCT Application No. PCT/US22/012841", dated May 12, 2022, 12 Pages.

* cited by examiner

SYSTEMS AND METHODS FOR IMMERSION COOLING WITH SUBCOOLED SPRAY

CROSS-REFERENCE TO RELATED APPLICATIONS

This application claims priority to and the benefit of U.S. Provisional Patent Application No. 63/144,371, filed on Feb. 1, 2021, which is hereby incorporated by reference in its entirety.

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Liquid cooling can effectively cool components as liquid working fluids have more thermal mass than air or gas cooling. The liquid working fluid can be maintained at a lower temperature by allowing vaporized fluid to rise out of the liquid. The vapor in the cooling liquid can adversely affect the cooling performance of the working fluid. The vapor can be condensed and returned to the immersion tank.

BRIEF SUMMARY

In some embodiments, a thermal management system for cooling electronics includes an immersion tank, a working fluid in the immersion tank, a heat exchanger, a first fluid conduit, and a second fluid conduit. The heat exchanger is configured to transfer thermal energy from the working fluid to ambient air to cool the working fluid. The first fluid conduit provides fluid communication from the immersion tank to the heat exchanger, and the second fluid conduit provides fluid communication from the heat exchanger to a spray nozzle to spray working fluid into the immersion tank.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to systems and methods for thermal management of electronic devices or other heat-generating components. Immersion chambers surround the heat-generating components in a liquid working fluid, which conducts heat from the heat-generating components to cool the heat-generating components. As the working fluid absorbs heat from the heat-generating components, the temperature of the working fluid increases and the working fluid may vaporize, introducing vapor into the liquid of the working fluid.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion tank and a condenser to extract heat from the vapor of the working fluid. The condenser then condenses the vapor phase of the working fluid into a liquid phase and returns the liquid working fluid to the immersion chamber of the immersion tank. In smaller distributed data centers, a low maintenance option for high efficiency immersion cooling is beneficial. An air-cooled immersion cooling system can eliminate potential failure points and maintenance requirements associated with liquid-cooled or water-cooled immersion cooling systems.

Figure 1:
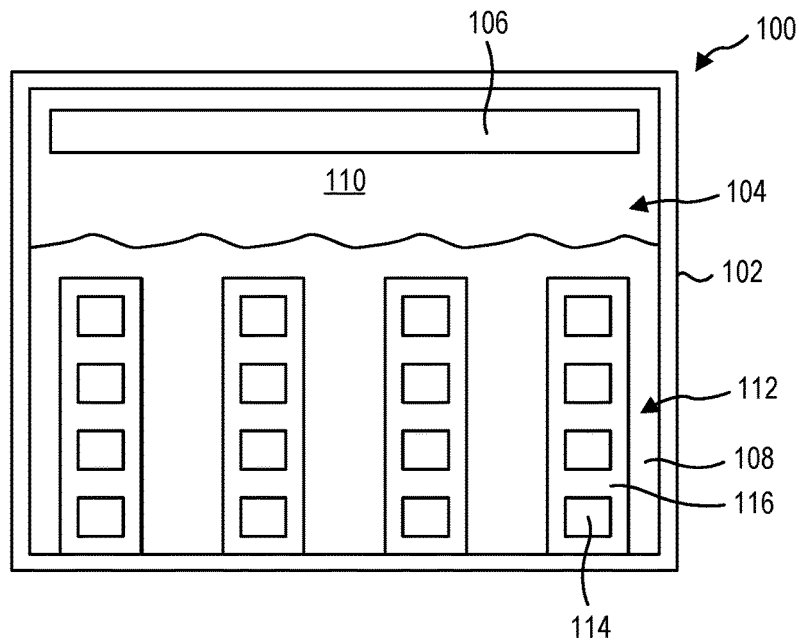
FIG. 1 is a side schematic representation of an immersion cooling system, according to at least one embodiment of the present disclosure.

A conventional immersion cooling system 100, shown in FIG. 1, includes an immersion tank 102 containing an immersion chamber 104 and a condenser 106 in the immersion chamber 104. The immersion chamber 104 contains a working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
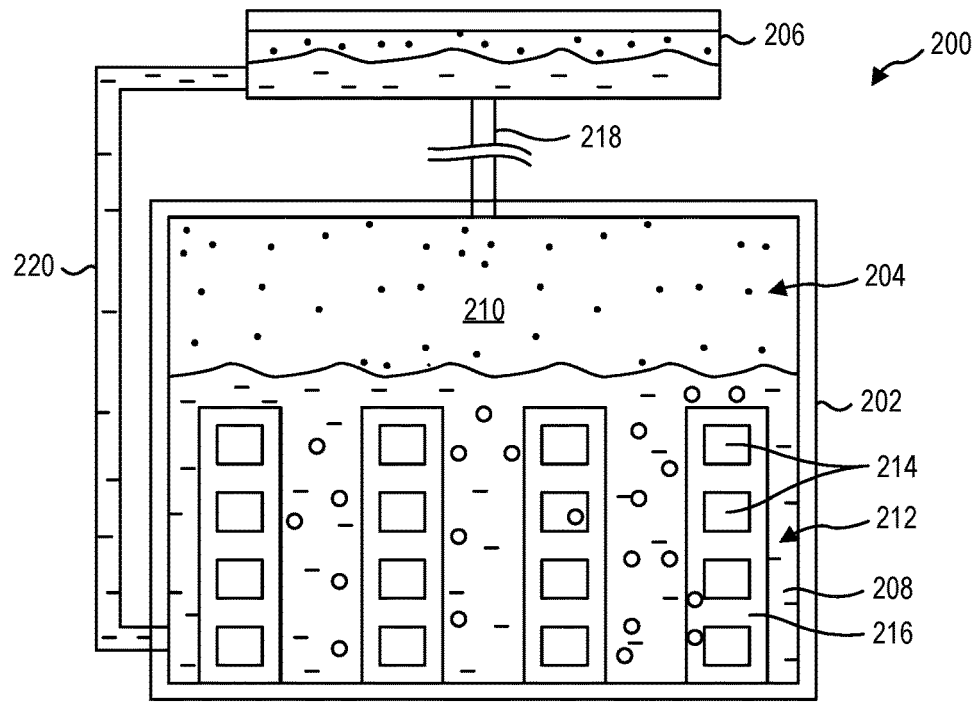
FIG. 2 is a side schematic representation of an immersion cooling system with an external condenser, according to at least one embodiment of the present disclosure.

Referring now to FIG. 2, an immersion cooling system 200 according to the present disclosure includes an immersion tank 202 defining an immersion chamber 204 with a working fluid positioned therein. The working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat-generating components 214 include an electric motor.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In conventional immersion cooling systems, a liquid-cooled condenser is integrated into the immersion tank and/or the chamber to efficiency remove the thermal energy from the working fluid. In some embodiments according to the present disclosure, an immersion cooling system 200 for thermal management of computing devices allows at least one immersion tank 202 and/or chamber 204 to be connected to and in fluid communication with an external condenser 206. In some embodiments, an immersion cooling system includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some embodiments, the liquid working fluid 208 receives heat in a cooling volume of working fluid immediately surrounding the heat-generating components 214. The cooling volume is the region of the working fluid (including both liquid and vapor phases) that is immediately surrounding the heat-generating components 214 and is responsible for the convective cooling of the heat-generating components 214. In some embodiments, the cooling volume is the volume of working fluid within 5 millimeters (mm) of the heat-generating components 214. In some embodiments, the cooling volume is the volume of working fluid within 5 mm of the vertical stacks (supports 216 and heat-generating components 214). In some embodiments, the cooling volume is defined by a vertical cylinder around each of the vertical stacks where no portion of the cylinder is outside 5 mm of the heat-generating components.

The working fluid has a boiling temperature below a critical temperature at which the heat-generating components experience thermal damage. For example, the heat-generating components may be computing components that experience damage above 100° Celsius (C.). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid. Similar to a cold plate or cold surface in a conventional condenser, the droplets are the subcooled surface that allow condensation upon the droplets themselves.

In some embodiments, an immersion cooling system 200 according to the present disclosure includes an air-cooled condenser 206. A liquid-cooled condenser can introduce couplings and/or conduits that are potential failure points. Leaks in the condenser can adversely affect the reliability of the condenser, risking the cooling efficiency of the immersion cooling system 200. In some examples, a liquid-cooled condenser that is water-cooled can introduce water into the working fluid of the immersion cooling system 200, increasing the boiling temperature of the working fluid. Changes to the boiling temperature of the working fluid can result in the heat-generating components achieving higher-than-intended temperatures, which may risk damage to the heat-generating components.

Figure 3:
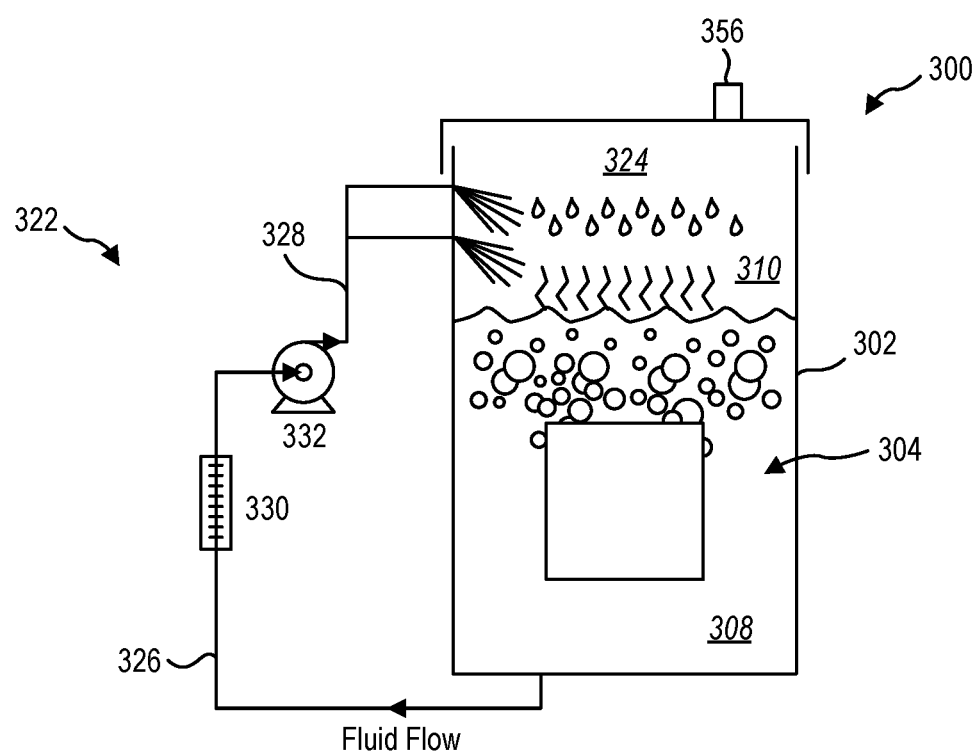
FIG. 3 is a schematic view of an immersion cooling system with subcooled liquid working fluid, according to at least one embodiment of the present disclosure.

FIG. 3 is a schematic diagram of an immersion cooling system 300 according to some embodiments of the present disclosure. The immersion tank 302 defines an immersion chamber 304 and the immersion cooling system lacks a conventional condenser. In some embodiments, the liquid working fluid 308 flows through one or more fluid conduits 322 to cool outside of the immersion chamber 304.

In some embodiments according to the present disclosure, an immersion cooling system 300 cools the vapor using a portion of the liquid phase of the working fluid (e.g., the liquid working fluid 308). For example, and in contrast of a conventional system, the vapor working fluid 310 is not extracted from the immersion chamber 304 or immersion tank 302, but is rather condensed in the headspace 324, such that the condensed working fluid falls back into the immersion bath. Additionally, subcooling the liquid working fluid 308 before reintroduction into the immersion tank 302 allows for cooling the vapor working fluid 310 and/or the liquid working fluid 308 in the immersion bath below the condensation temperature. In contrast, a conventional cold plate condenser will condense the vapor working fluid 310, but the condensate will then drip off the cold plate before continuing to cool below the condensation temperature. As such, the temperature of the immersion bath may remain at or near the boiling temperature (e.g., the condensation temperature).

An immersion cooling system according to the present disclosure removes a portion of the liquid working fluid 308 from the immersion bath, flows the portion of the liquid working fluid 308 through a hot fluid conduit 326 outside of the immersion chamber 304, which allows the liquid working fluid 308 to cool below the temperature of the liquid working fluid 308 of the immersion bath and below the temperature of the vapor working fluid 310 of the headspace 324. The subcooled portion of the liquid working fluid can subsequently be reintroduced into the immersion chamber 304 by a subcooled return line 328 through the headspace 324 to cool and condense at least part of the vapor working fluid 310.

In some embodiments, the immersion cooling system 300 cools the liquid working fluid 308 to create the subcooled portion of the liquid working fluid 308 through convective cooling to the ambient atmosphere from the fluid conduit 326, 328. In some embodiments, the fluid conduit 326, 328 includes one or more coils to increase the length of and surface area of the fluid conduit 326, 328 to further facilitate cooling of the liquid working fluid 308 in the fluid conduit 326, 328. In some embodiments, the immersion cooling system includes a heat exchanger 330 in fluid communication with the fluid conduit 326, 328 to more efficiently transfer heat from the portion of the liquid working fluid 308 in the fluid conduit 326, 328 to cool the liquid working fluid 308 to create the subcooled portion.

For example, a first fluid conduit 326 may be connected to the immersion tank 302 and allow fluid communication from the immersion chamber 304 to the heat exchanger 330. The portion of the liquid working fluid 308 can, therefore, flow from the immersion bath through the first fluid conduit 326 (e.g., the hot fluid conduit) to the heat exchanger 330. The hot liquid working fluid 308 can pass through or on the heat exchanger 330, which draws thermal energy from the liquid working fluid 308 to cool the liquid working fluid 308. Upon passing through or by the heat exchanger 330, the liquid working fluid 308 is subcooled (e.g., cooled below the temperature of the immersion bath and below the temperature of the vapor working fluid in the headspace). The subcooled portion of the liquid working fluid 308 is then reintroduced into the immersion chamber 304 through the headspace 324 to cool and/or condense the vapor working fluid 310.

In some embodiments, a plurality of immersion tanks is connected to a shared fluid conduit or hot fluid conduit, which is, in turn, connected to a shared heat exchanger, providing redundancy and scalability in the immersion capacity of the cooling system. In some embodiments, the hot fluid conduit and/or subcooled return line are connected to a plurality of heat exchangers, providing redundancy and scalability in the cooling capacity of the immersion cooling system.

In some embodiments, the immersion tank 302 defines the immersion chamber 304 in fluid communication with the fluid conduit(s) 326, 328. In some embodiments, a fluid pump 332 is positioned in-line with the fluid conduit(s). In some embodiments, a fluid pump 332 is positioned in-line with the first fluid conduit 326 (e.g., the hot fluid conduit) before a heat exchanger 330. In some embodiments, a fluid pump 332 is positioned in-line with the second fluid conduit 328 (e.g., the subcooled return line) after a heat exchanger 330.

In some embodiments, the immersion tank 302 includes a non-condensable gas vent 336 in fluid communication with the headspace 324. When working on an immersion cooling system, such as installing, uninstalling, or repairing the immersion cooling system, as well as installing, uninstalling, or repairing heat-generating components in the immersion cooling system, non-condensable gases may be introduced into the system. It should be understood that a non-condensable gas, as described herein, includes any gaseous element or compound that is not condensable into a liquid phase by the condenser. For example, while the working fluid is condensable by the condenser during normal operational conditions, binary oxygen ($O_2$) is not. Conversely, while $O_2$ is condensable into a liquid phase at extremely low temperatures, such condensation is beyond the capability or intent of condensers according to the present disclosure, and $O_2$ is an example of a non-condensable gas. Other common non-condensable gases that may be introduced into the system include nitrogen and carbon dioxide. Non-condensable gases do not experience a phase change as they move through the immersion cooling system cycle. Therefore, the non-condensable gases do not allow for the same level of thermal energy transport as the working fluid moving between liquid and vapor phases, and the non-condensable gases can compromise the thermal management capacity of the immersion cooling system.

Cooling of the gases in the headspace 324 will condense the vapor working fluid 310 more than non-condensable gases, resulting in a stratification of the working fluid and the non-condensable gases in the headspace 324, with the non-condensable gases above the denser vapor working fluid 310. Non-condensable gases may be filtered from the headspace through the non-condensable gas vent 336. In some embodiments, the non-condensable gases are vented to atmosphere. In some embodiments, the non-condensable gases may be vented to another pipe or conduit to be collected. In some embodiments, the non-condensable gases vent is integrated into a lid of the immersion tank 302. The density of the vapor working fluid 310 and condensate (e.g., the liquid working fluid 308) will separate the material in the immersion tank 302 and allow the liquid working fluid 308 to return to the immersion tank 302.

Immersion cooling systems according to the present disclosure may include a variety of sensors to monitor the flowrate, pressure, temperature, density, or other properties and/or parameters of the immersion cooling system and/or working fluid. For example, sensors may be positioned at or in the immersion tank, the hot fluid conduit, the subcooled return line, the heat exchanger, other components of the immersion cooling system, or combinations thereof. In some embodiments, the immersion cooling system includes a plurality of at least one type of sensor to monitor changes to that property within the immersion cooling system. For example, an immersion cooling system according to the present disclosure may include temperature sensors at a plurality of locations in or on the immersion cooling system to monitor temperature gradients and cooling efficiency in the immersion cooling system.

Figure 4:
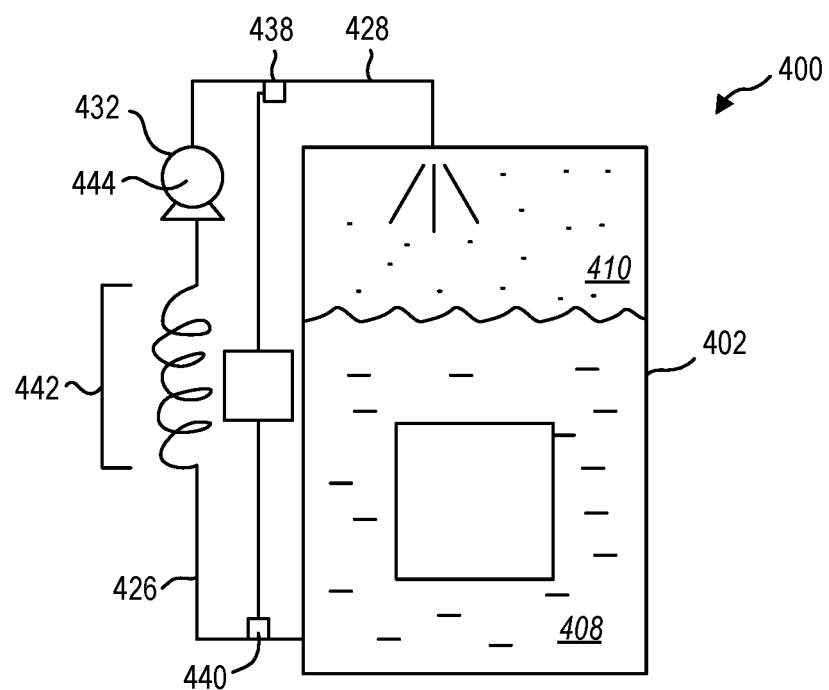
FIG. 4 is a schematic view of an immersion cooling system with a plurality of sensors to monitor system properties, according to at least one embodiment of the present disclosure.

FIG. 4 is a schematic representation of an immersion cooling system 400 with a plurality of sensors 438, 440 thereon. In some embodiments of immersion cooling systems, an immersion cooling system includes temperature and pressure sensors that measure a change in temperature and pressure across the fluid conduit(s). The immersion cooling system can use a first temperature and pressure sensor 438 positioned on the hot fluid conduit 426 proximate the immersion tank 402 to measure the temperature and pressure of the hot working fluid 408 exiting the immersion tank 402. The immersion cooling system 400 can use a second temperature and pressure sensor 440 positioned on the subcooled return line 428 proximate the immersion tank 402 to measure the temperature and pressure of the subcooled working fluid returning to the immersion tank 402. The differences between the two temperature and pressure sensors 438, 440 can provide a gradient that indicates the cooling efficiency of the heat exchanger (such as the heat exchanger 330 described in relation to FIG. 3) or the cooling efficiency of the conduit(s) 426, 428, themselves. For example, FIG. 4 illustrates an embodiment of an immersion cooling system 400 in which the conduit(s) 426, 428 include a coil 442 to extend the length of the conduit(s) 426, 428 and allow for more thermal energy to dissipate from the conduit(s) 426, 428 to the atmosphere.

The thermal gradient can be adjusted by changing a fan speed, flowrate, or other properties to change the amount by which the subcooled portion of the liquid working fluid 408 is subcooled. In some embodiments, the thermal gradient is at least 4° C. In some embodiments, the thermal gradient is at least 5° C. In some embodiments, the thermal gradient is at least 6° C. In some embodiments, the thermal gradient is at least 8° C.

In some embodiments, an immersion cooling system includes one or more flowrate sensors 444. The flowrate sensors 444 can monitor the rate of transport of the working fluid through the hot fluid conduit 426 and/or the subcooled return line 428. The flowrate may have an effect on the amount of cooling the liquid working fluid 408 experiences while in the fluid conduit(s) 426, 428. For example, a lower flowrate may cool the liquid working fluid 408 more, as the liquid working fluid 408 will have a longer duration of exposure to the heat exchanger and/or the thermal gradient to the ambient atmosphere. Additionally, the flowrate through the fluid conduit(s) 426, 428 also impacts the mass of the subcooled liquid working fluid that is reintroduced into the headspace to cool and condense the vapor working fluid 410. A greater mass has a larger thermal capacity to cool the vapor working fluid 410. In some embodiments, the flowrate sensor 444 is in communication with or incorporated into the fluid pump 432.

Some embodiments of a heat exchanger according to the present embodiment are air cooled heat exchangers that dissipate heat from the working fluid to the surrounding air. An air-cooled heat exchanger is lower maintenance and more reliable than a liquid-cooled heat exchanger. The air-cooled heat exchanger includes a thermally conductive material that transfers heat from the working fluid to air passing over a heat exchanger. In some embodiments, the heat exchanger includes one or more features or structures to increase surface area of the heat exchanger. For example, the heat exchanger may include a plurality of fins or columns that receive heat from the working fluid and conduct the heat to the air through convective heat transfer. The fins may be positioned substantially parallel to one another to allow airflow through the spaces between the fins. In some examples, the heat exchanger may include a heat spreader that increases the surface area exposed to the air. In some examples, the heat spreader is integrated with the fins or columns. In some examples, the heat exchanger includes a vapor chamber or heat pipe(s) to efficiently move heat across a large surface area.

The heat exchanger can include a variety of features or designs to facilitate thermal energy transfer from the hot liquid working fluid. In some embodiments, the heat exchanger includes a plurality of heat pipes. The heat pipes can provide a relatively large surface area over which the hot liquid working fluid can pass to receive thermal energy from the hot liquid working fluid, while also allowing a relatively large surface area over which the heat pipes can reject the thermal energy to the ambient atmosphere. In some embodiments, the heat exchanger can include heat fins, rods, or other structures that increase surface area to reject the thermal energy to the ambient atmosphere.

In some embodiments, a heat exchanger includes active cooling, such as a fan or blower to force air past the heat exchanger. The fan may be an axial fan, a centrifugal blower, or a mixed flow fan. In some embodiments, the fan is an electric fan powered by an external power source. In some embodiments, the fan is a thermoelectric fan that generates power from a temperature gradient, such as between the hot vapor working fluid and the surrounding air. A thermoelectric fan may flow air faster when the temperature gradient is larger, providing an adaptive and self-powering fan.

Figure 5:
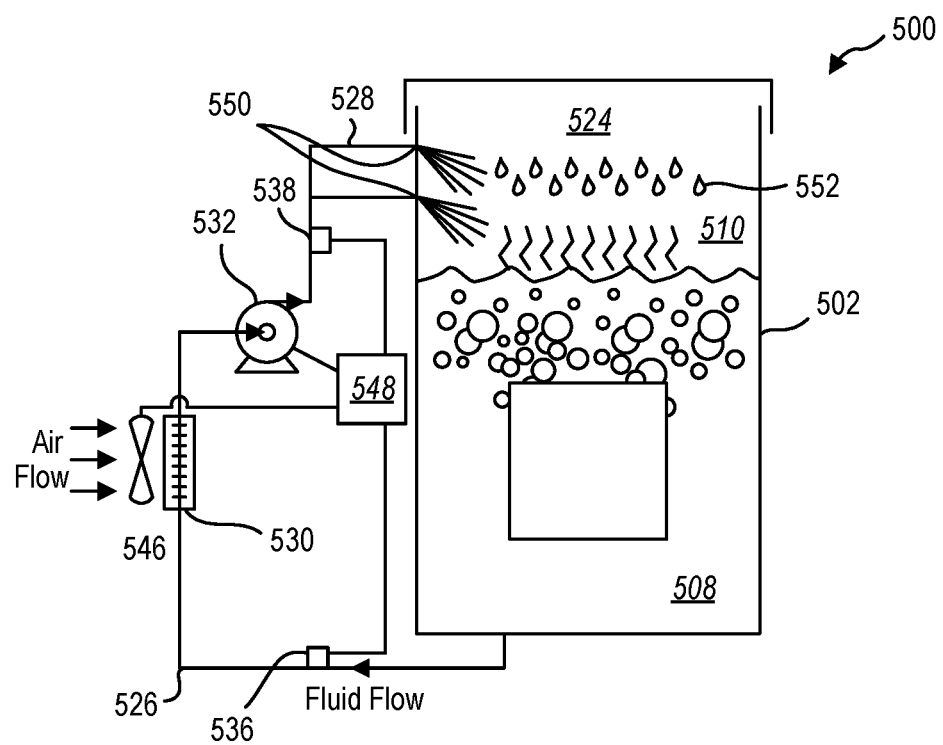
FIG. 5 is a schematic representation of an immersion cooling system with a logic controller to adjust one or more properties of the immersion cooling system, according to at least one embodiment of the present disclosure.

FIG. 5 is a schematic representation of an immersion cooling system 500 with active cooling in the form of a fan 546 and a logic controller 548 to control one or more operations of the immersion cooling system 500. The convective cooling of the flowing air over and/or through the heat exchanger 530 can further cool the heat exchanger 530, which, in turn, increases the thermal gradient with the hot liquid working fluid 508. The larger thermal gradient can increase the thermal transfer rate and cool the liquid working fluid 508 faster and/or more.

The immersion cooling system may include a plurality of fans to provide redundancy to the heat exchanger. In some embodiments, at least two of the plurality of fans are the same, such that the second fan can replace the functionality and provide a backup to the first fan. In some embodiments, the immersion cooling system includes at least two different fans (e.g., an axial fan and a centrifugal blower or axial fans of different sizes) that provide efficient airflow at different flowrates. The immersion cooling system can operate one or both of the two different fans based on the properties measured by the sensors (such as the temperature and pressure sensors and the flowrate sensor).

The subcooled working fluid may be reintroduced into the headspace 524 to cool the vapor working fluid 510 through one or more spray nozzles 550. The spray nozzle 550 sprays the subcooled working fluid to create a plurality of droplets 552. The plurality of droplets 552 has an increased surface area to cool and condense the vapor working fluid 510 relative to a solid volume of subcooled working fluid, and the droplets 552 may provide a site onto which the vapor working fluid 510 may condense, further lessened the energy required to condense the vapor working fluid 510. Similar to a cold plate or cold surface in a conventional condenser, the droplets are the subcooled surface that allow condensation upon the droplets themselves.

In some embodiments, the spray nozzles 550 are located on a sidewall of the immersion tank 502. In some embodiments, the spray nozzles 550 are located on top wall or lid of the immersion tank 502. In some embodiments, the spray nozzles 550 are located on both the sidewall and the top wall or lid of the immersion tank 502. In some embodiments, the spray nozzles are positioned in the immersion bath of the liquid working fluid 508 to spray the droplets 552 upward into the headspace 524 to increase the duration of exposure of the droplets 552 to the vapor working fluid 510.

In some embodiments, the immersion cooling system 500 includes one or more sensors to determine when the immersion tank 502 is open to atmosphere. The immersion cooling system 500 may shut off the flow of the subcooled working fluid when the immersion tank 502 is open to limit and/or prevent loss of the working fluid and to limit and/or prevent mixing of non-condensable gases into the immersion tank 502. In some embodiments, the immersion cooling system 500 may provide no flow of the subcooled working fluid for a predetermined duration after closing the immersion tank 502 to allow the non-condensable gases to stratify for venting through the non-condensable gas vent.

The spray nozzles 550 may be adjustable to vary the size of the droplets 552 depending upon desired flowrate through the nozzles 550 and the desired droplet size. In some embodiments, the spray nozzles 550 create a plurality of droplets 552 with an average droplet diameter of less than 1 millimeter. In some embodiments, the spray nozzles 550 create a plurality of droplets 552 with an average droplet diameter of less than 0.5 millimeters. In some embodiments, the spray nozzles 550 create a plurality of droplets 552 with an average droplet diameter of less than 0.25 millimeters. In some embodiments, the spray nozzles 550 create a plurality of droplets 552 with an average droplet diameter of less than 0.1 millimeters. In some embodiments, the spray nozzle 550 sprays the subcooled working fluid onto another component, such as a fan, which further disrupts the surface tension and creates the droplets 552 and/or more droplets.

In some embodiments, a logic controller 548 or other computing device is in communication with the sensor(s) 536, 538, fluid pump 532, fan 546, spray nozzle 550, or combinations thereof. The logic controller 548 may adjust the flowrate, droplet size, temperature gradient, or combinations thereof, based on measurements from the sensor(s) 536, 538. For example, if the logic controller 548 receives a measurement from a sensor that the temperature of the liquid working fluid 508 of the immersion bath is increasing, the logic controller 548 may increase the fan speed to cool the liquid working fluid passing through or over the heat exchanger 530 more. The increased thermal gradient between the subcooled working fluid droplets 552 and the vapor working fluid 510 in the headspace 524 may condense more of the vapor working fluid 510 and faster. Additionally, the increase in temperature of the liquid working fluid 508 of the immersion bath also means that the temperature of the portion of the liquid working fluid drawn into the fluid conduit(s) 526, 528 is increasing, and more cooling of the liquid working fluid 508 in the heat exchanger 530 may be needed to achieve a desired temperature of the subcooled working fluid.

In another example, the logic controller 548 may increase the flowrate from the fluid pump 532 to introduce a larger mass of subcooled working fluid droplets 552 into the headspace 524 in response to an increase in temperature of the liquid working fluid 508 of the immersion bath. In another example, the logic controller 548 may adjust the spray nozzles 550 to alter the flowrate and/or droplet size in response to an increase in temperature of the liquid working fluid 508 of the immersion bath.

Figure 6:
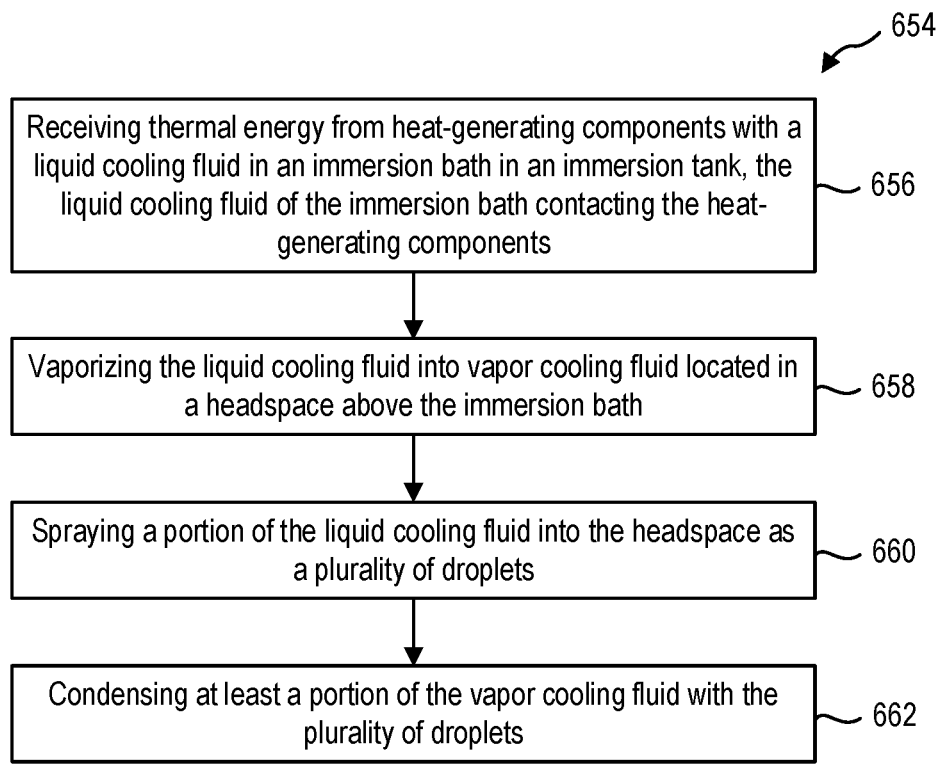
FIG. 6 is a flowchart illustrating a method of thermal management, according to at least one embodiment of the present disclosure.

In some embodiments, the logic controller 548 includes a processor and hardware storage device, the hardware storage device having instruction stored thereon that, when executed by the processor, cause the logic controller and immersion cooling system to perform any of the methods described herein. For example, FIG. 6 is a flowchart illustrating an embodiment of a method 654 of thermal management performed by one or more immersion cooling systems described herein. In some embodiments, the immersion cooling system may receive thermal energy from heat-generating components with a liquid working fluid in an immersion bath in an immersion tank at 656. The thermal energy vaporizes the liquid working fluid into a vapor working fluid that rises into the headspace above the immersion bath at 658. The method further includes spraying a portion of the liquid working fluid into the headspace as a plurality of droplets at 660 and condensing at least a portion of the vapor working fluid with the plurality of droplets 662. As described herein, the logic controller may adjust one or more properties of the immersion cooling system to adjust the thermal gradient, flowrate, droplet size, or other properties to thermally manage the heat-generating components.

INDUSTRIAL APPLICABILITY

The present disclosure relates generally to systems and methods for thermal management of electronic devices or other heat-generating components. Immersion chambers surround or partially surround the heat-generating components in a liquid working fluid, which conducts heat from the heat-generating components to cool the heat-generating components. As the working fluid absorbs heat from the heat-generating components, the temperature of the working fluid increases and the working fluid may vaporize, introducing vapor into the liquid of the working fluid. The vapor will rise due to buoyancy in the opposite direction of gravity, accumulating in a headspace of the immersion chamber above the immersion bath of liquid working fluid.

An immersion cooling system according to the present disclosure includes an immersion chamber with a working fluid positioned therein. The working fluid transitions between a liquid phase and a vapor phase to remove heat from hot or heat-generating components in the chamber. The liquid phase more efficiency receives heat from the components and, upon transition to the vapor phase, the working fluid can be cooled and condensed to extract the heat from the working fluid before the working fluid is returned to the liquid immersion bath at a lower temperature.

In some embodiments, the immersion bath of the liquid working fluid has a plurality of heat-generating components positioned in the liquid working fluid. The liquid working fluid surrounds the heat-generating components and other objects or parts attached to the heat-generating components. In some embodiments, the heat-generating components are positioned in the liquid working fluid on one or more supports. The support may support one or more heat-generating components in the liquid working fluid and allow the working fluid to move around the heat-generating components. In some embodiments, the support is thermally conductive to conduct heat from the heat-generating components. The support(s) may increase the effective surface area from which the working fluid may remove heat through convective cooling. In some embodiments, one or more of the heat-generating components includes a heat sink or other device attached to the heat-generating component to conduct away thermal energy and effectively increase the surface area of the heat-generating component.

As described, conversion of the liquid working fluid to a vapor phase requires the input of thermal energy to overcome the latent heat of vaporization and may be an effective mechanism to increase the thermal capacity of the working fluid and remove heat from the heat-generating components. Because the vapor rises in the liquid working fluid, the vapor phase of the working fluid accumulates in an upper vapor region of the chamber. Conventionally, a condenser cools part of the vapor of the working fluid back into a liquid phase, removing thermal energy from the system and reintroducing the working fluid into the immersion bath of the liquid working fluid. The condenser radiates or otherwise dumps the thermal energy from the working fluid into the ambient environment or into a conduit to carry the thermal energy away from the cooling system.

In conventional immersion cooling systems, the condenser is integrated into the immersion tank and/or the chamber to efficiency remove the thermal energy from the working fluid. The condenser, however, poses a potential failure point and leakage risk. Removal of the condenser can simplify the system and improve reliability.

In some embodiments according to the present disclosure, an immersion cooling system cools the vapor using a portion of the liquid phase of the working fluid. For example, and in contrast of a conventional system, the vapor is not extracted from the immersion chamber or immersion tank, but is rather condensed in the headspace, such that the condensed working fluid falls back into the immersion bath.

An immersion cooling system according to the present disclosure removes a portion of the liquid working fluid from the immersion bath, flows the portion of the liquid working fluid through a hot fluid conduit outside of the immersion chamber, which allows the liquid working fluid to cool below the temperature of the liquid working fluid of the immersion bath and below the temperature of the vapor working fluid of the headspace. The subcooled portion of the liquid working fluid can subsequently be reintroduced into the immersion chamber by a subcooled return line through the headspace to cool and condense at least part of the vapor working fluid.

In some embodiments, the immersion cooling system cools the liquid working fluid to create the subcooled portion of the liquid working fluid through convective cooling to the ambient atmosphere from the fluid conduit. In some embodiments, the fluid conduit includes one or more coils to increase the length of and surface area of the fluid conduit to further facilitate cooling of the liquid working fluid in the fluid conduit. In some embodiments, the immersion cooling system includes a heat exchanger in fluid communication with the fluid conduit to more efficiently transfer heat from the portion of the liquid working fluid in the fluid conduit to cool the liquid working fluid to create the subcooled portion.

For example, a first fluid conduit may be connected to the immersion tank and allow fluid communication from the immersion chamber to the heat exchanger. The portion of the liquid working fluid can, therefore, flow from the immersion bath through the first fluid conduit (e.g., the hot fluid conduit) to the heat exchanger. The hot liquid working fluid can pass through or on the heat exchanger, which draws thermal energy from the liquid working fluid to cool the liquid working fluid. Upon passing through or by the heat exchanger, the liquid working fluid is subcooled (e.g., cooled below the temperature of the immersion bath and below the temperature of the vapor working fluid in the headspace). The subcooled portion of the liquid working fluid is then reintroduced into the immersion chamber through the headspace to cool and/or condense the vapor working fluid.

In some embodiments, a plurality of immersion tanks is connected to a shared fluid conduit or hot fluid conduit, which is, in turn, connected to a shared heat exchanger, providing redundancy and scalability in the immersion capacity of the cooling system. In some embodiments, the hot fluid conduit and/or subcooled return line are connected to a plurality of heat exchangers, providing redundancy and scalability in the cooling capacity of the immersion cooling system.

In some embodiments, the working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components. In some embodiments, the cooling volume is the volume of working fluid within 5 mm of the vertical stacks (supports and heat-generating components). In some embodiments, the cooling volume is defined by a vertical cylinder around each of the vertical stacks where no portion of the cylinder is within 5 mm of the heat-generating components.

The working fluid has a boiling temperature below a critical temperature at which the heat-generating components experience thermal damage. For example, the heat-generating components may be computing components that experience damage above 100° Celsius (C.). In some embodiments, the boiling temperature of the working fluid is less than a critical temperature of the heat-generating components. In some embodiments, the boiling temperature of the working fluid is less about 90° C. In some embodiments, the boiling temperature of the working fluid is less about 80° C. In some embodiments, the boiling temperature of the working fluid is less about 70° C. In some embodiments, the boiling temperature of the working fluid is less about 60° C. In some embodiments, the boiling temperature of the working fluid is at least about 35° C. In some embodiments, the working fluid includes water. In some embodiments, the working fluid includes glycol. In some embodiments, the working fluid includes a combination of water and glycol. In some embodiments, the working fluid is an aqueous solution. In some embodiments, the working fluid is an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

In embodiments of immersion cooling systems with heat-generating components including computing components, similar computing components can be aggregated into stacks or series. For example, a first series of heat-generating components may be graphical processing units (GPUs) and a second series of heat-generating components may be central processing units (CPUs). In other examples, a first immersion cooling system houses GPUs and a second immersion cooling system houses CPUs.

In some embodiments, similar computing components can be aggregated into individual immersion tanks. For example, a first immersion tank may contain graphical processing units (GPUs) and a second immersion tank may contain central processing units (CPUs).

In some embodiments, the immersion tank defines the immersion chamber in fluid communication with the fluid conduit(s). In some embodiments, a fluid pump is positioned in-line with the fluid conduit(s). In some embodiments, a fluid pump is positioned in-line with the first fluid conduit (e.g., the hot fluid conduit) before a heat exchanger. In some embodiments, a fluid pump is positioned in-line with the second fluid conduit (e.g., the subcooled return line) after a heat exchanger.

In some embodiments, the immersion tank includes a non-condensable gas vent in fluid communication with the headspace. When working on the immersion cooling system, such as installing, uninstalling, or repairing the immersion cooling system, as well as installing, uninstalling, or repairing heat-generating components in the immersion cooling system, non-condensable gases may be introduced into the system. It should be understood that a non-condensable gas, as described herein, includes any gaseous element or compound that is not condensable into a liquid phase by the condenser. For example, while the working fluid is condensable by the condenser during normal operational conditions, binary oxygen ($O_2$) is not. Conversely, while $O_2$ is condensable into a liquid phase at extremely low temperatures, such condensation is beyond the capability or intent of condensers according to the present disclosure, and $O_2$ is an example of a non-condensable gas. Other common non-condensable gases that may be introduced into the system include nitrogen and carbon dioxide. Non-condensable gases do not experience a phase change as they move through the immersion cooling system cycle. Therefore, the non-condensable gases do not allow for the same level of thermal energy transport as the working fluid moving between liquid and vapor phases, and the non-condensable gases can compromise the thermal management capacity of the immersion cooling system.

Cooling of the gases in the headspace will condense the vapor working fluid more than non-condensable gases, resulting in a stratification of the working fluid and the non-condensable gases in the headspace, with the non-condensable gases above the denser vapor working fluid. Non-condensable gases may be filtered from the headspace through a vent. In some embodiments, the non-condensable gases are vented to atmosphere. In some embodiments, the non-condensable gases may be vented to another pipe or conduit to be collected. In some embodiments, the non-condensable gases vent is integrated into a lid of the immersion tank. The density of the vapor working fluid and condensate (e.g., the liquid working fluid) will separate the material in the immersion tank and allow the liquid working fluid to return to the immersion tank.

In some embodiments, the immersion cooling system includes one or more sensors to determine when the immersion tank is open to atmosphere. The immersion cooling system may shut off the flow of the subcooled working fluid when the immersion tank is open to limit and/or prevent loss of the working fluid and to limit and/or prevent mixing of non-condensable gases into the immersion tank. In some embodiments, the immersion cooling system may provide no flow of the subcooled working fluid for a predetermined duration after closing the immersion tank to allow the non-condensable gases to stratify for venting through the non-condensable gas vent.

Immersion cooling systems according to the present disclosure may include a variety of sensors to monitor the flowrate, pressure, temperature, density, or other properties and/or parameters of the immersion cooling system and/or working fluid. For example, sensors may be positioned at or in the immersion tank, the hot fluid conduit, the subcooled return line, the heat exchanger, other components of the immersion cooling system, or combinations thereof. In some embodiments, the immersion cooling system includes a plurality of at least one type of sensor to monitor changes to that property within the immersion cooling system. For example, an immersion cooling system according to the present disclosure may include temperature sensors at a plurality of locations in or on the immersion cooling system to monitor temperature gradients and cooling efficiency in the immersion cooling system.

In some embodiments of immersion cooling systems, an immersion cooling system includes temperature and pressure sensors that measure a change in temperature and pressure across the fluid conduit(s). The immersion cooling system can use a first temperature and pressure sensor positioned on the hot fluid conduit proximate the immersion tank to measure the temperature and pressure of the hot working fluid exiting the immersion tank. The immersion cooling system can use a second temperature and pressure sensor positioned on the subcooled return line proximate the immersion tank to measure the temperature and pressure of the liquid working fluid returning to the immersion tank. The differences between the two temperature and pressure sensors can provide a gradient that indicates the cooling efficiency of the heat exchanger.

In some embodiments, an immersion cooling system includes one or more flowrate sensors. The flowrate sensors can monitor the rate of transport of the working fluid through the hot fluid conduit and/or the subcooled return line. The flowrate may have an effect on the amount of cooling the liquid working fluid experiences while in the fluid conduit(s). For example, a lower flowrate may cool the liquid working fluid more, as the liquid working fluid will have a longer duration of exposure to the heat exchanger and/or the thermal gradient to the ambient atmosphere. Additionally, the flowrate through the fluid conduit(s) also impacts the mass of the subcooled liquid working fluid that is reintroduced into the headspace to cool and condense the vapor working fluid. A greater mass has a larger thermal capacity to cool the vapor working fluid.

Some embodiments of a heat exchanger according to the present embodiment are air cooled heat exchangers that dissipate heat from the working fluid to the surrounding air. An air-cooled heat exchanger is lower maintenance and more reliable than a liquid-cooled heat exchanger. The air-cooled heat exchanger includes a thermally conductive material that transfers heat from the working fluid to air passing over a heat exchanger. In some embodiments, the heat exchanger includes one or more features or structures to increase surface area of the heat exchanger. For example, the heat exchanger may include a plurality of fins or columns that receive heat from the working fluid and conduct the heat to the air through convective heat transfer. The fins may be positioned substantially parallel to one another to allow airflow through the spaces between the fins. In some examples, the heat exchanger may include a heat spreader that increases the surface area exposed to the air. In some examples, the heat spreader is integrated with the fins or columns. In some examples, the heat exchanger includes a vapor chamber or heat pipe(s) to efficiently move heat across a large surface area.

The heat exchanger can include a variety of features or designs to facilitate thermal energy transfer from the hot liquid working fluid. In some embodiments, the heat exchanger includes a plurality of heat pipes. The heat pipes can provide a relatively large surface area over which the hot liquid working fluid can pass to receive thermal energy from the hot liquid working fluid, while also allowing a relatively large surface area over which the heat pipes can reject the thermal energy to the ambient atmosphere. In some embodiments, the heat exchanger can include heat fins, rods, or other structures that increase surface area to reject the thermal energy to the ambient atmosphere.

In some embodiments, a heat exchanger includes active cooling, such as a fan or blower to force air past the heat exchanger. The fan may be an axial fan, a centrifugal blower, or a mixed flow fan. In some embodiments, the fan is an electric fan powered by an external power source. In some embodiments, the fan is a thermoelectric fan that generates power from a temperature gradient, such as between the hot vapor working fluid and the surrounding air. A thermoelectric fan may flow air faster when the temperature gradient is larger, providing an adaptive and self-powering fan.

The convective cooling of the flowing air over and/or through the heat exchanger can further cool the heat exchanger, which, in turn, increases the thermal gradient with the hot liquid working fluid. The larger thermal gradient can increase the thermal transfer rate and cool the liquid working fluid faster and/or more.

The immersion cooling system may include a plurality of fans to provide redundancy to the heat exchanger. In some embodiments, at least two of the plurality of fans are the same, such that the second fan can replace the functionality and provide a backup to the first fan. In some embodiments, the immersion cooling system includes at least two different fans (e.g., an axial fan and a centrifugal blower or axial fans of different sizes) that provide efficient airflow at different flowrates. The immersion cooling system can operate one or both of the two different fans based on the properties measured by the sensors (such as the temperature and pressure sensors and the flowrate sensor).

The subcooled working fluid may be reintroduced into the headspace to cool the vapor working fluid through one or more spray nozzles. The spray nozzle sprays the subcooled working fluid to create a plurality of droplets. The plurality of droplets has an increased surface area to cool and condense the vapor working fluid relative to a solid volume of subcooled working fluid, and the droplets may provide a site onto which the vapor working fluid may condense, further lessened the energy required to condense the vapor working fluid.

In some embodiments, the spray nozzles are located on a sidewall of the immersion tank. In some embodiments, the spray nozzles are located on top wall or lid of the immersion tank. In some embodiments, the spray nozzles are located on both the sidewall and the top wall or lid of the immersion tank. In some embodiments, the spray nozzles are positioned in the immersion bath of the liquid working fluid 508 to spray the droplets upward into the headspace to increase the duration of exposure of the droplets to the vapor working fluid.

The spray nozzles may be adjustable to vary the size of the droplets depending upon desired flowrate through the nozzles and the desired droplet size. In some embodiments, the spray nozzles create a plurality of droplets with an average droplet diameter of less than 1 millimeter. In some embodiments, the spray nozzles create a plurality of droplets with an average droplet diameter of less than 0.5 millimeters. In some embodiments, the spray nozzles create a plurality of droplets with an average droplet diameter of less than 0.25 millimeters. In some embodiments, the spray nozzles create a plurality of droplets with an average droplet diameter of less than 0.1 millimeters. In some embodiments, the spray nozzle sprays the subcooled working fluid onto another component, such as a fan, which further disrupts the surface tension and creates the droplets and/or more droplets.

In some embodiments, a logic controller or other computing device is in communication with the sensor(s), fluid pump, fan, spray nozzle, or combinations thereof. The logic controller may adjust the flowrate, droplet size, temperature gradient, or combinations thereof, based on measurements from the sensor(s). For example, if the logic controller receives a measurement from a sensor that the temperature of the liquid working fluid of the immersion bath is increasing, the logic controller may increase the fan speed to cool the liquid cooling passing through or over the heat exchanger more. The increased thermal gradient between the subcooled working fluid and the vapor working fluid in the headspace may condense more of the vapor working fluid and faster. Additionally, the increase in temperature of the liquid working fluid of the immersion bath also means that the temperature of the portion of the liquid working fluid drawn into the fluid conduit(s) is increasing, and more cooling of the liquid working fluid in the heat exchanger may be needed to achieve a desired temperature of the subcooled working fluid.

In another example, the logic controller may increase the flowrate from the fluid pump to introduce a larger mass of subcooled working fluid into the headspace in response to an increase in temperature of the liquid working fluid of the immersion bath. In another example, the logic controller may adjust the spray nozzles to alter the flowrate and/or droplet size in response to an increase in temperature of the liquid working fluid of the immersion bath.

In some embodiments, the logic controller includes a processor and hardware storage device, the hardware storage device having instruction stored thereon that, when executed by the processor, cause the logic controller and immersion cooling system to perform any of the methods described herein. For example, the immersion cooling system may receive thermal energy from heat-generating components with a liquid working fluid in an immersion bath in an immersion tank. The thermal energy vaporizes the liquid working fluid into a vapor working fluid that rises into the headspace above the immersion bath. The method further includes spraying a portion of the liquid working fluid into the headspace as a plurality of droplets and condensing at least a portion of the vapor working fluid with the plurality of droplets. As described herein, the logic controller may adjust one or more properties of the immersion cooling system to adjust the thermal gradient, flowrate, droplet size, or other properties to thermally manage the heat-generating components.

The present disclosure relates to systems and methods for cooling heat-generating components of a computer or computing device according to at least the examples provided in the sections below:

(A1) In some embodiments, a thermal management system for cooling electronics includes an immersion tank, a working fluid in the immersion tank, a heat exchanger, a first fluid conduit, and a second fluid conduit. The heat exchanger is configured to transfer thermal energy from the working fluid to ambient air to cool the working fluid. The first fluid conduit provides fluid communication from the immersion tank to the heat exchanger, and the second fluid conduit provides fluid communication from the heat exchanger to a spray nozzle to spray working fluid into the immersion tank.

(A2) In some embodiments, a thermal management system such as described in (A1) includes at least one heat-generating component positioned at least partially in an immersion bath of liquid working fluid in the immersion tank.

(A3) In some embodiments, a heat exchanger such as described in (A1) is configured to lower a temperature of the working fluid by at least 4° C.

(A4) In some embodiments, a first fluid conduit such as described in (A1) is coupled to the immersion tank to provide fluid communication with an immersion bath of liquid working fluid in the immersion tank and draw liquid working fluid from the immersion bath.

(A5) In some embodiments, a thermal management system such as described in (A1) includes at least one heat-generating component positioned at least partially in an immersion bath of liquid working fluid in the immersion tank.

(A6) In some embodiments, a spray nozzle such as described in (A1) distributes liquid working fluid in droplets having an average droplet size less than 1 mm in diameter.

(A7) In some embodiments, a working fluid such as described in (A1) has a boiling temperature less than 60° C.

(A8) In some embodiments, a spray nozzle such as described in (A1) is positioned on a side surface of the immersion tank.

(A9) In some embodiments, a spray nozzle such as described in (A1) is positioned on a top surface of the immersion tank.

(A10) In some embodiments, a heat exchanger such as described in (A1) includes a plurality of heat pipes.

(A11) In some embodiments, a heat exchanger such as described in (A1) includes a thermal transfer coil.

(A12) In some embodiments, a heat exchanger such as described in (A1) includes a fan configured to flow air through the heat exchanger.

(A13) In some embodiments, a thermal management system such as described in (A1) includes a fluid pump positioned in-line in the first fluid conduit or the second fluid conduit.

(B1) In some embodiments, a thermal management system includes an immersion tank, a working fluid in the immersion tank, a heat exchanger, a first fluid conduit, a second fluid conduit, at least one sensor to measure a temperature of the working fluid, a fan configured to flow air through the heat exchanger, a fluid pump, and a logic controller. The heat exchanger is configured to transfer thermal energy from the working fluid to ambient air to cool the working fluid. The first fluid conduit provides fluid communication from the immersion tank to the heat exchanger, and the second fluid conduit provides fluid communication from the heat exchanger to a spray nozzle to spray working fluid into the immersion tank. The fluid pump is positioned in-line in the first fluid conduit or the second fluid conduit. The logic controller is in data communication with the at least one sensor and with the fan and the fluid pump to adjust the fan or fluid pump in response to a measured temperature of the working fluid.

(C1) In some embodiments, a method of thermal management for heat-generating components includes receiving thermal energy from heat-generating components with a liquid working fluid in an immersion bath in an immersion tank, the liquid working fluid of the immersion bath contacting the heat-generation components; vaporizing the liquid working fluid into a vapor working fluid located in a headspace above the immersion bath; spraying a portion of the liquid working fluid into the headspace as a plurality of droplets; and condensing at least a portion of the vapor working fluid with the plurality of droplets.

(C2) In some embodiments, a method of thermal management such as described in (C1) includes cooling the portion of the liquid working fluid with a heat-exchanger outside of the immersion tank.

(C3) In some embodiments, a temperature difference between a plurality of droplets and a vapor working fluid such as described in (C1) is at least 4° C.

(C4) In some embodiments, a method of thermal management such as described in (C1) includes measuring a temperature of the immersion bath; and adjusting a temperature difference between the plurality of droplets and the vapor working fluid based on the temperature of the immersion bath.

(C5) In some embodiments, adjusting a temperature difference such as described in (C1) includes changing a fan speed of a heat exchanger.

(C6) In some embodiments, adjusting a temperature difference such as described in (C1) includes changing a flowrate of liquid working fluid through a heat exchanger.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system comprising:
an immersion tank;
a working fluid at least partially positioned in the immersion tank, wherein the working fluid provides an immersion bath configured to have a heat-generating component at least partially immersed therein;
a heat exchanger configured to transfer thermal energy from the working fluid to ambient air to cool the working fluid;
a first fluid conduit providing fluid communication from the immersion tank to the heat exchanger; and
a second fluid conduit providing fluid communication from the heat exchanger to a spray nozzle to spray working fluid into a headspace of the immersion tank above the immersion bath, the spray of working fluid configured to condense at least a portion of a vapor phase of the working fluid into the immersion bath.

2. The thermal management system of claim 1, further comprising at least one heat-generating component positioned at least partially in the immersion bath of liquid working fluid in the immersion tank.

3. The thermal management system of claim 1, further comprising a vapor working fluid positioned in the headspace of the immersion tank above the immersion bath of liquid working fluid in the immersion tank.

4. The thermal management system of claim 1, wherein the heat exchanger is configured to lower a temperature of the working fluid by at least 4° C.

5. The thermal management system of claim 1, wherein the first fluid conduit is coupled to the immersion tank to provide fluid communication with the immersion bath of liquid working fluid in the immersion tank and draw liquid working fluid from the immersion bath.

6. The thermal management system of claim 1, wherein the spray nozzle distributes liquid working fluid in droplets having an average droplet size less than 1 mm in diameter.

7. The thermal management system of claim 1, wherein the working fluid has a boiling temperature less than 60° C.

8. The thermal management system of claim 1, wherein the spray nozzle is positioned on a side of the immersion tank.

9. The thermal management system of claim 1, wherein the spray nozzle is positioned on a top surface of the immersion tank.

10. The thermal management system of claim 1, wherein the heat exchanger includes a plurality of heat pipes.

11. The thermal management system of claim 1, wherein the heat exchanger includes a thermal transfer coil.

12. The thermal management system of claim 1, wherein the heat exchanger includes a fan configured to flow air through the heat exchanger.

13. The thermal management system of claim 1, further comprising a fluid pump positioned in-line in the first fluid conduit or the second fluid conduit.

14. A thermal management system comprising:
an immersion tank;
a working fluid at least partially positioned in the immersion tank, wherein the working fluid provides an immersion bath configured to have a heat-generating component at least partially immersed therein;
a heat exchanger configured to transfer thermal energy from the working fluid to ambient air to cool the working fluid;
a first fluid conduit providing fluid communication from the immersion tank to the heat exchanger;
a second fluid conduit providing fluid communication from the heat exchanger to a spray nozzle to spray working fluid into the immersion tank, wherein the spray nozzle is positioned on a side of the immersion tank, and wherein the spray of working fluid is configured to condense at least a portion of a vapor phase of the working fluid into the immersion bath;
at least one sensor to measure a temperature of the working fluid;
a fan configured to flow air through the heat exchanger;
a fluid pump positioned in-line in the first fluid conduit or the second fluid conduit; and
a logic controller in data communication with the at least one sensor and with the fan and the fluid pump to adjust the fan or fluid pump in response to a measured temperature of the working fluid.

15. A method of thermal management for heat-generating components with the thermal management system of claim 1, the method comprising:
receiving thermal energy from heat-generating components with the liquid working fluid in the immersion bath in the immersion tank, the liquid working fluid of the immersion bath contacting the heat-generation components;
vaporizing the liquid working fluid into a vapor working fluid located in the headspace above the immersion bath;
spraying a portion of the liquid working fluid into the headspace as a plurality of droplets; and
condensing at least a portion of the vapor working fluid with the plurality of droplets.

16. The method of claim 15, further comprising cooling the portion of the liquid working fluid with a heat-exchanger outside of the immersion tank.

17. The method of claim 15, wherein a temperature difference between the plurality of droplets and the vapor working fluid is at least 4° C.

18. The method of claim 15, further comprising:
measuring a temperature of the immersion bath; and
adjusting a temperature difference between the plurality of droplets and the vapor working fluid based on the temperature of the immersion bath.

19. The method of claim 18, wherein adjusting the temperature difference includes changing a fan speed of a heat exchanger.

20. The method of claim 18, wherein adjusting the temperature difference includes changing a flowrate of liquid working fluid through a heat exchanger.

* * * * *